(12) United States Patent
Ono et al.

(10) Patent No.: US 11,129,319 B2
(45) Date of Patent: Sep. 21, 2021

(54) COORDINATE DATA GENERATION DEVICE AND COORDINATE DATA GENERATION METHOD

(71) Applicant: FUJI CORPORATION, Chiryu (JP)

(72) Inventors: Keiichi Ono, Anjo (JP); Takahiro Kobayashi, Chiryu (JP); Hiroshi Oike, Chiryu (JP); Yuta Yokoi, Kariya (JP)

(73) Assignee: FUJI CORPORATION, Chiryu (JP)

( * ) Notice: Subject to any disclaimer, the term of this patent is extended or adjusted under 35 U.S.C. 154(b) by 155 days.

(21) Appl. No.: 16/480,562

(22) PCT Filed: Jan. 31, 2017

(86) PCT No.: PCT/JP2017/003486
§ 371 (c)(1),
(2) Date: Jul. 24, 2019

(87) PCT Pub. No.: WO2018/142492
PCT Pub. Date: Aug. 9, 2018

(65) Prior Publication Data
US 2019/0357397 A1 Nov. 21, 2019

(51) Int. Cl.
*H05K 13/08* (2006.01)
*G06T 7/73* (2017.01)
(Continued)

(52) U.S. Cl.
CPC ....... *H05K 13/0815* (2018.08); *G06T 7/0004* (2013.01); *G06T 7/73* (2017.01);
(Continued)

(58) Field of Classification Search
CPC ........... H05K 13/0815; H05K 13/0812; H05K 13/0409; H05K 13/0061; H05K 13/086; H05K 13/0857; H05K 13/04; H05K 13/08; G06T 7/73; G06T 7/0004; G06T 2207/30141; G06T 2207/30204
(Continued)

(56) References Cited

U.S. PATENT DOCUMENTS 10,743,447 B2 * 8/2020 Murai ................ H05K 13/0812
2007/0034695 A1 * 2/2007 Vullings .............. H05K 1/0266
235/454

(Continued)

FOREIGN PATENT DOCUMENTS

JP 4499661 B2 7/2010

OTHER PUBLICATIONS

International Search Report dated Apr. 25, 2017 in PCT/JP2017/003486 filed Jan. 31, 2017.

*Primary Examiner* — Jerome Grant, II
(74) *Attorney, Agent, or Firm* — Oblon, McClelland, Maier & Neustadt, L.L.P.

(57) ABSTRACT

A coordinate data generation device is used in a component mounter configured to perform processing for mounting electronic components on boards of different dimensions by imaging the board that is controlled to be conveyed and stopped at a target position and performing the mounting of the electronic components after correcting for a deviation between a stopping position of the board identified from an image captured by the imaging and a target position, and specifies an imaging region for imaging the board stopped at the stopping position.

5 Claims, 5 Drawing Sheets

(51) Int. Cl.
 *G06T 7/00* (2017.01)
 *H05K 13/04* (2006.01)

(52) U.S. Cl.
 CPC .............. *H05K 13/0812* (2018.08); *G06T 2207/30141* (2013.01); *G06T 2207/30204* (2013.01); *H05K 13/0409* (2018.08)

(58) Field of Classification Search
 USPC ..................................................... 382/147
 See application file for complete search history.

(56) References Cited

U.S. PATENT DOCUMENTS

| | | | |
|---|---|---|---|
| 2010/0168891 A1* | 7/2010 | Kretsis | G01S 5/163 700/98 |
| 2020/0093042 A1* | 3/2020 | Oike | H05K 13/0812 |
| 2020/0271592 A1* | 8/2020 | Kobayashi | G01N 21/8851 |
| 2020/0281105 A1* | 9/2020 | Onishi | H05K 13/0815 |
| 2020/0375075 A1* | 11/2020 | Oyama | H05K 13/0815 |

* cited by examiner

COORDINATE DATA GENERATION DEVICE AND COORDINATE DATA GENERATION METHOD

TECHNICAL FIELD

Technology of the present disclosure relates to a coordinate data generation device and coordinate data generation method used in a component mounter that performs processing for mounting electronic components on a board after correcting a deviation between a target position and a stopping position of the board identified from an image captured of the board, control being performed such that the board is conveyed and stopped at the target position and boards of different sizes can have components mounted on them.

BACKGROUND ART

Among component mounters that mount electronic components on a board, there are those that convey a board to a mounting position at which electronic components are to be mounted using a conveyance device arranged in the component mounter. With such a component mounter, it is necessary to check whether the board has been accurately conveyed to the target position. For example, this type of component mounter may be provided with a camera provided with a downward facing field of view, such that marks for detecting the position of the board that are provided on an upper surface of the board can be imaged using the camera. With this component mounter, when a board is conveyed inside the component mounter, the marks on the upper surface of the board are imaged with the camera. Then, the position of the marks is detected from the captured image, and the deviation between the stopping position of the board and a target position is calculated based on the position of the marks. For example, in JP 4,499,661, an example is disclosed of a component mounter that calculates the deviation between the stopping position of the board and the target position based on the detection of the mark positions.

BRIEF SUMMARY

Problem to be Solved

A component mounter as described above is able to calculate a deviation amount of the board from the target position by detecting the position of marks provided on the board when the stopping position of the board deviates from the target position as the board is conveyed to the mounting position. After calculating the deviation amount, the mounting position of electronic components can be corrected taking into consideration the deviation amount. However, if the board deviates a large amount from the target position due to factors such as the shape or weight of the board, there may be cases in which the marks on the board are outside the imaging range of the camera. In this case, because the position of the marks on the board cannot be calculated, it is not possible to calculate the deviation amount of the board from the target position. Disclosed herein is technology for reliably calculating a deviation amount from a target position of a board conveyed inside a component mounter.

Means for Solving the Problem

A coordinate data generation device of the present disclosure is used in a component mounter configured to perform processing for mounting electronic components on boards of different dimensions by imaging the board that is controlled to be conveyed and stopped at a target position and performing the mounting of the electronic components after correcting for a deviation between a stopping position of the board identified from an image captured by the imaging and a target position. The coordinate data generation device specifies an imaging region for imaging the board stopped at the stopping position. The coordinate data generation device is provided with: a target position information input section configured to receive an input of information related to the target position that is set shared between the boards of different dimensions for which handling is possible by the component mounter; a board information input section configured to receive input of board information including a dimension of the board in a first direction parallel to a conveyance direction of the board, and a dimension of the board in a second direction perpendicular to the conveyance direction; and a coordinate data generation section configured to generate coordinate data such that an edge of the board is within the imaging region based on the information related to the target position, the dimension of the board in the first direction, and the dimension of the board in the second direction.

With the above coordinate data generation device, coordinate data is generated such that an edge of the board is included within the imaging region. Thus, compared to a case in which a mark on the board is imaged, it is easy to make sure that the edge of the board is within the imaging region even if the board deviates from the target position by a relatively large amount. So long as the edge of the board can be imaged, by using the position of the edge of the board identified by image processing, it is possible to calculate the deviation amount of the board, and the board deviation amount can be calculated easily. Also, information related to the target position at which the board is to be stopped is set in the coordinate data generation device regardless of the dimensions of the board being processed. Thus, it is possible to generate coordinate data that specifies the imaging region such that the edge of the board is included in the imaging region based on information related to the target position, a dimension of the board in the first direction, and a dimension of the board in the second direction. Therefore, when a dimension of the board being processed changes, simply by inputting the dimension of the board, it is possible to set the imaging region. Further, because the coordinate data generation device generates the coordinate data based on the information related to the target position, the dimension of the board in the first direction, and the dimension of the board in the second direction, an operator no longer has to perform work of setting coordinate data.

Also, a coordinate data generation method of the present disclosure is used in a component mounter configured to perform processing for mounting electronic components on boards of different dimensions by imaging the board that is controlled to be conveyed and stopped at a target position and performing the mounting of the electronic components after correcting for a deviation between a stopping position of the board identified from an image captured by the imaging and a target position. The coordinate data generation method is for specifying an imaging region for imaging the board stopped at the stopping position. The coordinate data generation method includes: a target position information input process of receiving an input of information related to the target position that is set shared between the boards of different dimensions for which handling is possible by the component mounter; a board information input process of receiving input of board information including a dimension of the board in a first direction parallel to a conveyance direction of the board, and a dimension of the board in a second direction perpendicular to the conveyance direction; and a first coordinate data generation process of generating coordinate data such that an edge of the board is within the imaging region based on the information related to the target position, the dimension of the board in the first direction, and the dimension of the board in the second direction. According to this method, it is possible to realize the same effects as the above coordinate data generation device.

DESCRIPTION OF EMBODIMENTS

The main features of embodiments are described below as examples of the disclosure. Note that, technical elements described in this specification and in the drawings exhibit technical utility alone or in various combinations, and are not limited to the combination of the described aspects of the application.

Characteristic 1

With a coordinate data generation device according to the present disclosure, the board information may further include arrangement positions of support pins that support the stopped board, and arrangement positions of lands provided on the board. The coordinate data generation section may generate the coordinate data such that the support pins and the lands are not positioned within the imaging region based on the arrangement positions of the support pins and the arrangement positions of the lands. According to such a configuration, by generating coordinate data such that the support pins and the lands are not positioned within the imaging region, it is possible to prevent the support pins or lands being captured in the imaging region. Accordingly, misdetection of an edge due to imaging of the support pins or the lands can be avoided.

Characteristic 2

With a coordinate data generation device of the present disclosure, a position detection mark may be provided on an imaging surface of the board. The coordinate data generation section may generate the coordinate data such that, among the edges of the board that form an outline of the board, the edge for which the distance from the position detection mark is shortest is included in the imaging region. According to such a configuration, by setting the imaging region for board edge detection to a position near a position detection mark provided on the board, the imaging region for imaging the position detection mark and the imaging region for board edge detection are close to each other. This, it is possible to shorten the moving distance of the imaging device, and the processing time for imaging both can be made short.

Characteristic 3

With a coordinate data generation device of the present disclosure, the coordinate data generation section may be configured to generate the coordinate data such that a position at a center in the second direction of the edge that is the front edge of the board in the first direction when the board is positioned at the target position is at center coordinates of the imaging region. According to such a configuration, with regard to the coordinates in the first direction, by making the position the front edge when the board is positioned at the target position, it is possible to reliably detect the deviation in the first direction of the board. Also, with regard to the coordinates in the second direction, by making the position the center of the front edge when the board is positioned at the target position, it is possible to avoid imaging a member inside the component mounter such as a conveyance-use member or the like.

Characteristic 4

With a coordinate data generation device according to the present disclosure, the board information may further include arrangement positions of support pins that support the stopped board, and arrangement positions of lands provided on the board. The coordinate data generation device may also be provided with a reporting section configured to, when it is determined that at least one of the support pins or the lands is positioned within the imaging region that is specified by the coordinate data generation section, report that the at least one of the support pins or the lands is positioned within the imaging region. According to such a configuration, when a support pin or a land is positioned within the imaging region set based on the generated coordinate data, it is possible to report that fact to an operator. If a support pin or land is positioned within the imaging region, this may lead to misdetection of the edge. Thus, the operator can know that the generated coordinate data is not appropriate.

Characteristic 5

With a coordinate data generation method according to the present disclosure, the board information may further include arrangement positions of support pins that support the stopped board, and arrangement positions of lands provided on the board. The coordinate data generation method may further include a second coordinate generation process of, when it is determined that at least one of the support pins or the lands is positioned within the imaging region that is specified by the first coordinate data generation process, generating the coordinate data such that the support pins and the lands are not positioned within the imaging region based on the arrangement positions of the support pins and the arrangement positions of the lands. According to such a configuration, it is possible to generate coordinate data using the second coordinate data generation process such that the support pins and lands are not positioned within the imaging region even in a case in which the support pins or lands are positioned within the imaging region due to the first coordinate data generation process. Accordingly, misdetection of an edge due to imaging of the support pins or the lands can be avoided.

First Embodiment

Coordinate data generation device 100 of an embodiment is described below. Coordinate data generation device 100 is configured to generate coordinate data that specifies an imaging region for imaging circuit board 2 conveyed inside component mounter 10.

First, component mounter 10 that uses coordinate data generation device 100 is described. Component mounter 10 is a device for mounting electronic components 4 on circuit board 2. Usually, component mounter 10 is set up with other board work machines such as a solder printer and board inspection machine to form a mounting line. Circuit board 2 is conveyed from one end to the other end of the component mounting line. Predetermined electronic components 4 are mounted on circuit board 2 by each component mounter 10. Circuit board 2 conveyed to the end of the component mounting line is shipped as a final product or is sent to a later process as a work-in-progress. Component mounter 10 is connected to management device 8 such that communication is possible. Management device 8 is connected to component mounter 10 and other board work machines such that communication is possible and is configured to manage component mounter 10 and the other board work machines. Management device 8 is configured from a computer provided with a CPU and memory. Management device 8 performs control of the component mounting line overall by controlling operation of component mounters 10 and the other board work machines.

Figure 1:
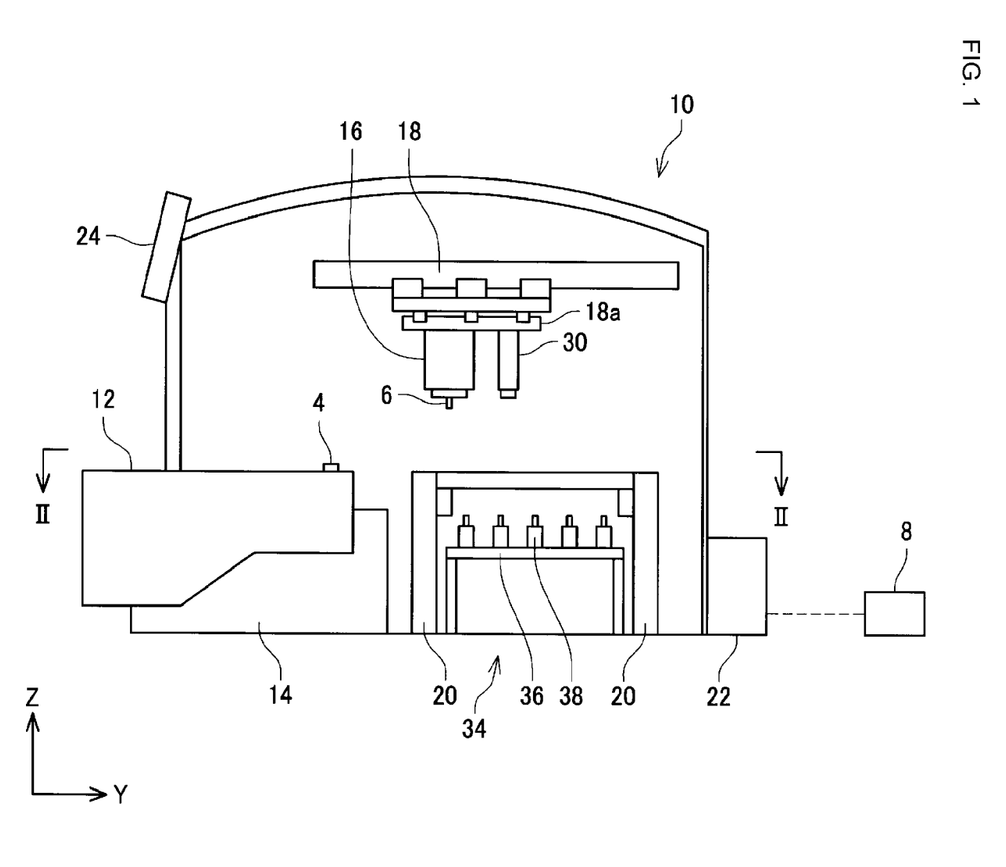
FIG. 1 shows an outline of the configuration of a component mounter.
Figure 2:
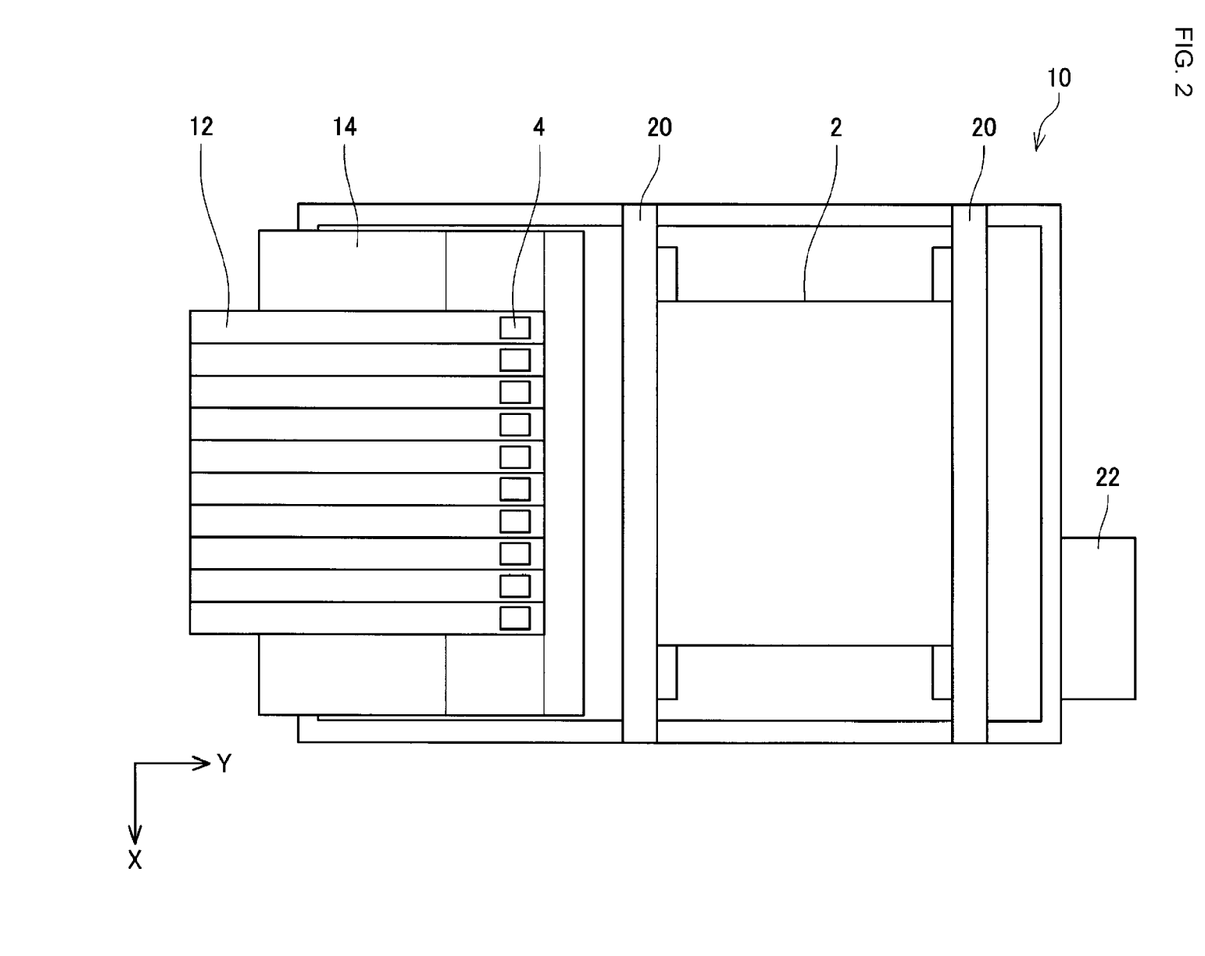
FIG. 2 is a cross section of at the line II-II of FIG. 1.

As shown in FIGS. 1 and 2, mounter 10 is provided with multiple component feeders 12, feeder holding section 14, mounting head 16, head moving device 18, imaging device 30, board conveyor 20, board holding device 34, control device 22, and touch panel 24. Each component feeder 12 houses multiple electronic components 4. Component feeders 12 are detachably attached to feeder holding section 14, and supply electronic components 4 to mounting head 16. The specific configuration of component feeders 12 is not particularly limited. Each component feeder 12, for example, may be a tape type feeder that stores multiple electronic components 4 in wound tape, a tray type feeder that stores multiple electronic components 4 on a tray, or a bulk type feeder that stores multiple electronic components 4 in a loose state in a container. Also, feeder holding section 14 may be fixed to component mounter 10, or may be detachable from component mounter 10.

Mounting head 16 includes suction nozzle 6 that picks up electronic component 4. Suction nozzle 6 is detachably attached to mounting head 16. Mounting head 16 is able to move suction nozzle 6 in the Z direction (here a vertical direction), so as to move suction nozzle 6 towards and away from component feeder 12 and circuit board 2. Mounting head 16 picks up electronic component 4 from component feeder 12 using suction nozzle 6, and mounts the electronic component 4 picked up by suction nozzle 6 on circuit board 2. Note that, mounting head 16 may include only a single suction nozzle 6, or may include multiple suction nozzles 6.

Head moving device 18 moves mounting head 16 between component feeder 12 and circuit board 2. As one example, head moving device 18 of the present embodiment is an XY robot that moves moving base 18a in the X direction and Y direction, with mounting head 16 being fixed to moving base 18a. Note that, mounting head 16 is not limited to being fixed to moving base 18a, and may be detachably attached to moving base 18a.

Imaging device 30 is fixed to moving base 18a and moves together with moving base 18a. Imaging device 30 is provided with a camera, a light source for illumination (not shown), and a prism (not shown). The camera is arranged facing down and is configured to image an upper surface of circuit board 2. The camera is, for example, a CCD camera.

The light source for illumination is configured from LEDs and illuminates the imaging surface of circuit board 2 (the XY plane surface in the present embodiment). The prism aligns the light axis of the camera with the imaging target. By illuminating the upper surface of circuit board 2 with the light source for illumination and guiding reflected light with the prism to the camera, the camera images the upper surface of circuit board 2. Image data of the image captured by imaging device 30 is memorized in the memory of control device 22.

Board conveyor 20 conveys circuit board 2 in the X direction. Board conveyor 20 is configured from a pair of conveyors arranged separated by a gap in the Y direction and extending parallel in the X direction. Board conveyor 20 receives circuit board 2 from an adjacent component mounter (or other board work machine such as a solder printer) and conveys the circuit board 2 to a predetermined component mounting position. When mounting of electronic components 4 onto circuit board 2 is complete, board conveyor 20 unloads the circuit board 2 to a component mounter (or other board work machine such as a board inspection machine) adjacent to the other side. Board conveyor 20 of the present embodiment is a belt conveyor (not shown) in which a conveyor belt is driven by a motor, but the specific configuration of board conveyor 20 is not particularly limited. For example, board conveyor 20 may be a roller conveyor. Also, the pair of board conveyors 20 is configured to move towards and away from each other by the driving of an actuator (not shown).

Board support device 34 is a device for supporting, from below, circuit board 2 loaded on board conveyor 20. Board support device 34 is provided with multiple support pins 38 arranged on backup plate 36, and supports circuit board 2 from below by raising the support pins 38. The arrangement positions of the multiple support pins 38 can be changed according to the circuit pattern of the circuit board 2 on which mounting work is to be performed.

Touch panel 24 is a display device for providing various information of component mounter 10 to an operator, and a user interface for receiving various instructions and information from an operator. Control device 22 is configured from a computer provided with a CPU and memory. Control device 22 is connected to management device 8 such that communication is possible. Control device 22 controls operation of each section of component mounter 10 based on a production program sent from management device 8.

Component mounter 10 drives board conveyor 20 to convey circuit board 2 inside component mounter 10. Position detection mark 60 is provided on an upper surface (+Z direction) of circuit board 2, and when circuit board 2 is conveyed inside component mounter 10, mark 60 is imaged by imaging device 30 positioned at a predetermined imaging position. Then, the position of mark 60 is detected from the captured image, and the deviation between the stopping position of circuit board 2 and a target position is calculated based on the position of the detected mark 60. However, depending on factors such as the weight and shape of circuit board 2, there may be cases in which circuit board 2 stops at a position at which mark 60 cannot be imaged. Therefore, in the present embodiment, before imaging position detection mark 60, the edge of circuit board 2 is imaged and the position of the edge of circuit board 2 identified from the captured image is used. Described below is an example of a procedure for correcting the deviation between the stopping position of circuit board 2 and the target position.

First, control device 22 drives board conveyor 20 by a specified drive amount to convey circuit board 2 inside component mounter 10. Continuing, control device 22 moves head moving device 18 such that imaging can be performed of an imaging region set according to the coordinate data generated by coordinate data generation device 100 of the present embodiment, then images the imaging region using imaging device 30. Details are described later, but the coordinate data generated by coordinate data generation device 100 is set such that the edge of circuit board 2 inside the imaging region set by the coordinate data can be detected. Thus, the edge of circuit board 2 is captured in the image and it is possible to detect the edge of circuit board 2 from the captured image. Note that, if the conveyance distance of circuit board 2 deviates by a large amount from the target value and the edge of circuit board 2 cannot be detected from the captured image, control device 22 returns circuit board 2 to the position before conveyance and then performs conveyance of circuit board 2 into component mounter 10 again. Here, the driving amount of board conveyor 20 may be adjusted such that the conveyance distance of circuit board 2 is changed. Control device 22 repeats conveyance processing until the edge of circuit board 2 can be detected from the captured image. Upon detection of the edge of circuit board 2, control device 22 calculates the deviation amount of the stopping position with respect to the target position from the detected edge. Continuing, control device 22 corrects the stopping position of circuit board 2 or the imaging position for imaging mark 60 based on the calculated deviation amount, and images mark 60 using imaging device 30. Finally, control device 22 calculates the deviation amount of the position of circuit board 2 (highly accurate deviation amount) with respect to the target position from the captured image of mark 60. Coordinate data generation device 100 of the present embodiment generates coordinate data that specifies an imaging region for imaging the edge of circuit board 2 using imaging device 30.

Figure 3:
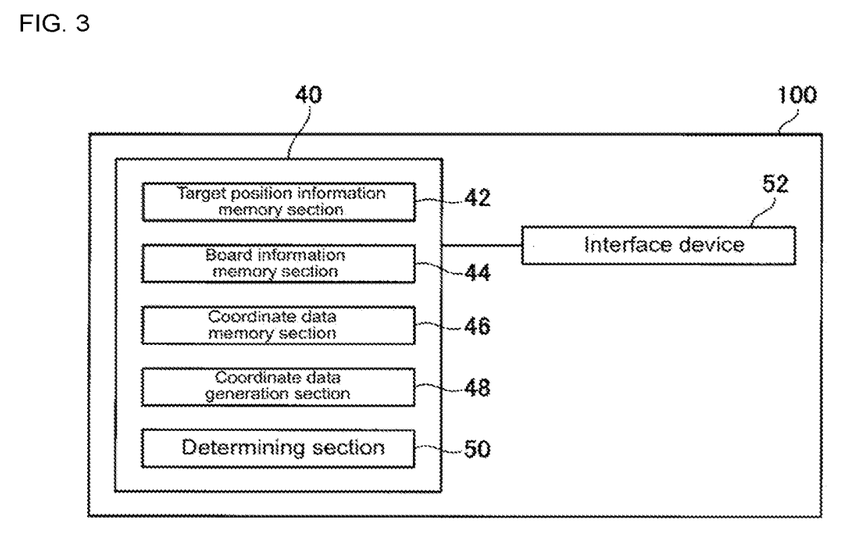
FIG. 3 shows the system configuration of a coordinate data generation device of a first embodiment.

As shown in FIG. 3, coordinate data generation device 100 is configured from calculating device 40, and interface device 52. Calculating device 40 may be configured from, for example, a computer provided with a CPU, ROM, RAM, and the like. By the computer executing a program, calculating device 40 functions as the coordinate data generation section 48 and determining section 50 as shown in FIG. 3. Details regarding processing of coordinate data generation section 48 and determining section 50 are given below.

Further, as shown in FIG. 3, calculating device 40 is provided with target position information memory section 42, board information memory section 44, and coordinate data memory section 46. Target position information memory section 42 memorizes information related to a target position for stopping circuit board 2 when conveying circuit board 2 into component mounter 10. The target position may be shared for different types of circuit boards even when the type of circuit board to be processed by component mounter 10 changes. Board information memory section 44 memorizes information related to circuit board 2 to be processed by component mounter 10. Information related to circuit board 2, for example, includes dimensions and shape of circuit board 2, arrangement positions of support pins 38 with respect to circuit board 2, and a wiring pattern or arrangement positions of lands provided on circuit board 2. Coordinate data memory section 46 memorizes coordinate data generated by coordinate data generation device 100.

Interface device 52 is a display device for presenting various information of coordinate data generation device 100 to an operator, and for receiving instructions and information from an operator. For example, interface device 52 is able to display items such as the position of the calculated coordinates, the imaging region set by the generated coordinate data, and error messages that report that the calculated coordinates are not appropriate as coordinate data to an operator. Also, interface device 52 may receive information related to a target position, board information, or input of a set of coordinates selected from coordinate candidates. Note that, interface device 52 is an example of a "target position information input section", a "board information input section", and a "reporting section".

Coordinate data generation device 100 is provided on management device 8. Coordinate data generated by coordinate data generation device 100 is sent to control device 22 provided in component mounter 10 via management device 8. Note that, coordinate data generation device 100 may be connected to control device 22 such that communication is possible, or coordinate data generation device 100 may directly send generated coordinate data to control device 22. Also, coordinate data generation device 100 of the present embodiment is provided in management device 8, but the configuration is not limited to this. The configuration may be such that coordinate data generated by coordinate data generation device 100 is acquired by control device 22 of component mounter 10, for example, coordinate data generation device 100 may be provided in component mounter 10.

Figure 4:
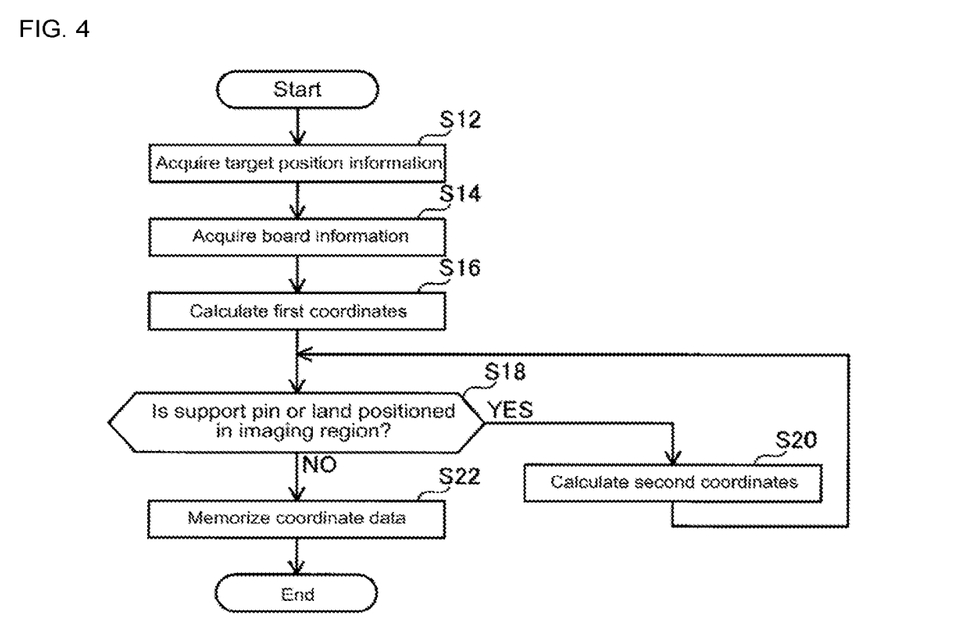
FIG. 4 is a flowchart showing an example of processing for generating coordinate data in the coordinate data generation device of the first embodiment.

FIG. 4 is a flowchart showing an example of processing for generating coordinate data in coordinate data generation device 100. As described above, coordinate data generation device 100 generates coordinate data such that the edge of circuit board 2 inside the imaging region set by the coordinate data can be detected. Processing for generating coordinate data performed by coordinate data generation device 100 is described below.

As shown in FIG. 4, first, calculating device 40 acquires information related to the target position (S12). Information related to the target position is information of the target position at which to stop circuit board 2 when circuit board 2 is conveyed into component mounter 10, for example, coordinate data of a target position to be used as a reference. The target position to be used as a reference can be set as a shared target position for different circuit boards even if the type (for example, shape, dimensions, or the like) of circuit board on which mounting processing is being performed changes.

Figure 5:
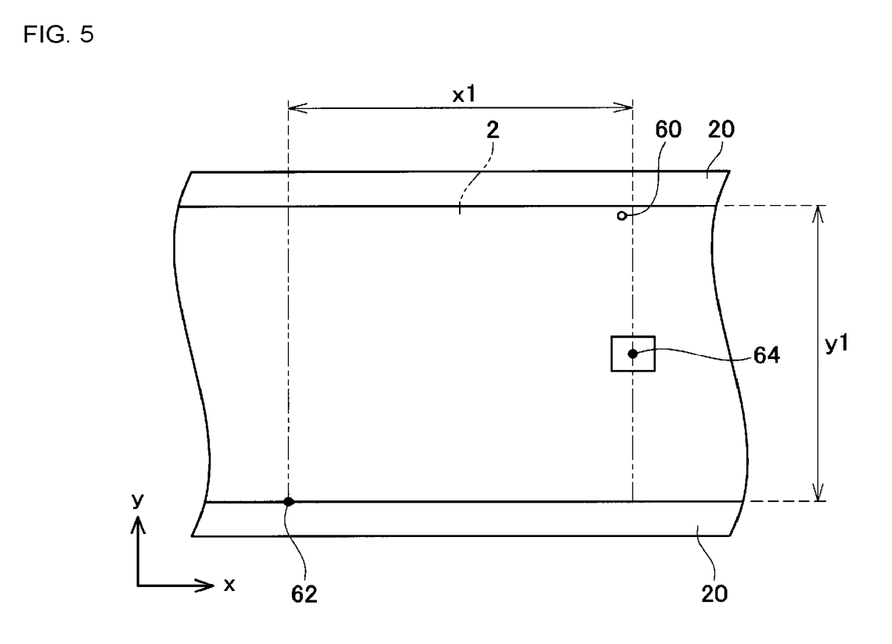
FIG. 5 illustrates an imaging region set by the coordinate data and center coordinates of the imaging region.

As shown in FIG. 5, for example, the target position to be used as a reference may be position 62 (also referred to as reference position 62) of end sections of circuit board 2 positioned in the −X direction and −Y direction with respect to the center of the circuit board when the circuit board is correctly conveyed into component mounter 10. If the target position to be used as a reference is set in this manner, even if the type of circuit board on which mounting processing is to be performed changes, the target position to be used as a reference can be shared for the different types of circuit board. In other words, even if the type of circuit board on which mounting processing is to be performed changes, various settings (for example, distance between the pair of board conveyors 20, arrangement positions of support pins 38, and so on) can be changed such that the end sections of the circuit board in the −X direction and −Y direction are aligned when the circuit board is conveyed into component mounter 10. Note that, the target position to be used as a reference is set using position 62 of end sections of circuit board 2 in the −X direction and −Y direction, but the configuration is not limited to this. For example, the target position to be used as a reference may be set using a center position of circuit board 2.

Information related to the target position (for example, coordinates of reference position 62) is entered by an operator using interface device 52. The entered information related to the target position is memorized in target position information memory section 42. Note that, information related to the target position may be acquired from memory of management device 8 and memorized in target position information memory section 42.

Next, calculating device 40 acquires board information. Board information is entered by an operator and memorized in board information memory section 44. Note that, board information may be acquired from memory of management device 8 and memorized in board information memory section 44. Board information of circuit board 2 is, for example, the dimensions and shape of circuit board 2, arrangement positions of support pins 38 with respect to circuit board 2, arranged positions of lands provided on circuit board 2, and the like. Component mounter 10 is able to mount electronic components 4 on multiple types of circuit board with different dimensions and mounting patterns. Information related to circuit board 2 is different for each type of circuit board 2. Board information memory section 44 memorizes the above information related to circuit board 2 on which mounting processing is to be performed.

Next, coordinate data generation section 48 calculates coordinates that are initial candidates for coordinate data to be generated (also referred to as first coordinates) based on the target information acquired in S12 and the board information acquired in S14 (S16). The first coordinates are calculated from the coordinates of the target position and the dimensions in the X-direction and the Y-direction of circuit board 2 included in the board information. Specifically, coordinate data generation section 48 calculates the first coordinates by the following procedure. First, coordinate data generation section 48 acquires information related to the coordinates of reference position 62 memorized on target position information memory section 42. Also, coordinate data generation section 48 acquires information related to the X-direction dimension and the Y-direction dimension of circuit board 2 memorized on board information memory section 44. Further, coordinate data generation section 48 uses a value of the X-direction dimension of circuit board 2 added to the value of the X coordinate of reference position 62 as the X coordinate of the first coordinates. And, coordinate data generation section 48 uses a value of half the Y-direction dimension of circuit board 2 added to the value of the Y coordinate of reference position 62 as the Y coordinate of the first coordinates. For example, if the coordinates of reference position 62 are (x, y), the X-direction dimension of circuit board 2 is x1, and the Y-direction dimension of circuit board 2 is y1, coordinate data generation section 48 calculates the first coordinates as (x+x1, y+[y1/2]). Note that, the X-direction dimension of circuit board 2 is an example of "a dimension of a board in a first direction", and the Y-direction dimension of circuit board 2 is an example of "a dimension of a board in a second direction".

By calculating the X coordinate of the first coordinates as above (for example, as x+x1), the first coordinates are in a position on the outline (also referred to as the front edge) of the circuit board 2 parallel to the Y direction that is the conveyance direction when circuit board 2 is stopped at the target position. Thus, when circuit board 2 is stopped at the target position, the front edge is detected in the center of the imaging region set as the center of the first coordinates. Therefore, when circuit board 2 is conveyed into component mounter 10, it is possible to more reliably detect the deviation of the stopping position of circuit board 2 in the conveyance direction. Further, by calculating the Y coordinate of the first coordinates as above (for example, as y+[y1/2]), the first coordinates are in a position at the center of the front edge of circuit board 2 when circuit board 2 is stopped at the target position. Therefore, when the imaging region is set centered around the first coordinates, the imaging region is set in the center of the front edge of circuit board 2 in the Y direction when circuit board 2 is set at the target position. For example, when the imaging region is set near to the end section of circuit board 2 (for example, near to the end section of the front edge in the +Y direction or the −Y direction), it is more likely that other configuration elements (members provided on component mounter 10) such as board conveyor 20 will be captured in the image. When a member other than the edge of circuit board 2 is included in the captured image, there is a possibility that misdetection will occur when detecting the edge from the image. By setting the first coordinates at the center in the Y direction of the front edge of circuit board 2 when circuit board 2 is stopped at the target position, it is possible to avoid misdetection of the edge.

Next, determining section 50 determines whether a support pin 38 or a land is positioned within the imaging region set centered around the first coordinates calculated in S16 (S18). The arrangement positions of support pins 38 and the arrangement positions of the lands are memorized on board information memory section 44. Support pins 38 are arranged on backup plate 36. The arrangement positions of support pins 38 are set according to the type of circuit board 2 on which mounting processing is to be performed. Determining section 50 determines whether support pins 38 are positioned within the imaging region centered around the first coordinates based on the information related to the arrangement positions of support pins 38 memorized on board information memory section 44. Also, as the lands are provided on circuit board 2, if the stopping position of circuit board 2 is deviated, the positions of the lands also change. Accordingly, determining section 50, in a case in which circuit board 2 is stopped at a position deviated to the uppermost side in the conveyance direction, determines whether the lands of circuit board 2 are positioned within the imaging region centered around the first coordinates.

In a case in which support pins 38 or the lands are positioned within the imaging region (yes in S18), processing proceeds to S20. On the other hand, in a case in which support pins 38 and the lands are not positioned within the imaging region (no in S18), processing proceeds to S22.

In a case in which support pins 38 or the lands are positioned within the imaging region (yes in S18), coordinate data generation section 48 calculates second coordinates that are different from the first coordinates (S20). If a support pin 38 or land is positioned within the imaging region, the support pin 38 or land will be captured in the image along with the edge of circuit board 2. If a support pin 38 or land is captured in the image, there is a possibility that misdetection will occur when detecting the edge from the image. Therefore, in a case in which support pin 38 or land is positioned within the imaging region centered around the first coordinates, coordinate data generation section 48 calculates second coordinates as a next candidate without using the first coordinates as coordinate data. Specifically, coordinate data generation section 48 moves only the Y coordinate without changing the X coordinate. Here, the movement direction of the Y coordinate is in the direction near to mark 60 provided on circuit board 2. For example, in FIG. 5, it is the +Y direction. As described above, the deviation in the stopping position of circuit board 2 is calculated from the deviation amount of mark 60 as well as calculated from the deviation amount of the edge. Further, imaging of the edge and imaging of mark 60 are performed by the same imaging device 30. By setting the imaging region for edge detection to a position near to the imaging region for mark 60 detection, the movement distance of imaging device 30 is made shorter. Accordingly, the time for imaging processing need to image both is reduced.

When the second coordinates have been calculated in S20, processing returns to S18. That is, determining section 50 determines whether a support pin 38 or a land is positioned within the imaging region set centered around the second coordinates. In a case in which support pins 38 and the lands are not positioned within the imaging region centered around the second coordinates (no in S18), processing proceeds to S22. On the other hand, in a case in which a support pin 38 or a land is positioned within the imaging region centered around the second coordinates (yes in S18), processing proceeds to S20 again and coordinate data generation section 4 calculated different coordinates again. That is, coordinate data generation section 48 calculates a Y coordinate moved even further. In this manner, steps S20 and S18 are repeated until there is no support pin 38 or land positioned within the imaging region. Note that, in a case in which no coordinate can be found in which the state is such that there is no support pin 38 or land positioned within the imaging region even by moving the Y coordinate closer to mark 60 (that is, by moving in the +Y direction as shown in FIG. 5), the Y coordinate may be moved in the direction away from mark 60 (that is, the −Y direction as shown in FIG. 5).

Once a coordinate at which there is no support pin 38 or land positioned within the imaging region is calculated, calculating device 40 memorizes the calculated coordinates in coordinate data memory section 46 (S22). Then, calculating device 40 ends coordinate data generation processing.

Coordinate data generation device 100 of the present embodiment generates coordinate data such that the edge of circuit board 2 is included within the imaging region based on the board information and the information related to the target position. As described above, component mounter 10 is able to mount electronic components 4 on multiple types of circuit board with different dimensions, shapes, and the like. Therefore, even if the type of circuit board changes, coordinate data generation device 100 is able to set the imaging region based on the board information of the changed circuit board. Thus, it is not necessary for an operator to perform setting of coordinate data.

Note that, in the present embodiment, in a case in which a support pin 38 or a land is positioned within the imaging region centered around the first coordinates, by changing the Y coordinate of the first coordinates, a coordinate is calculated such that there is no support pin 38 or land positioned within the imaging region. However, in a case in which it is not possible to detect a coordinate for which a support pin 38 or land is not positioned within the imaging region even by changing the Y coordinate of the first coordinates, for example, in a case in which there is no coordinate on the front edge for which there is no support pin 38 or land positioned in the imaging region, or a case in which the pitch at which the Y coordinate is moved is large, it may not be possible to calculate the coordinate data. In such a case, calculating device 40 displays an error message or the like on interface device 52 to inform the operator that the coordinate data could not be calculated. Further, an operator may enter the coordinate data using interface device 52 such that the imaging region is set as the set coordinate data.

Further, coordinate data generation device 100 of the present embodiment is configured to generate coordinate data that specifies an imaging region for imaging an edge of circuit board 2 conveyed inside component mounter 10, but the configuration is not limited to this. For example, coordinate data generation device 100 may generate coordinate data that specifies an imaging region for detecting an edge of circuit board 2 conveyance inside a board work machine such as a solder printer or a board inspection machine.

Also, in the present embodiment, coordinate data is generated such that a support pin 38 or land is not positioned within the imaging region set by the coordinate data, but the configuration is not limited to this. The coordinate data may be generated such that a member or the like that may cause misdetection when detecting an edge from the captured image is not positioned within the imaging region, for example, such that a wiring pattern of circuit board 2 is not positioned within the imaging region in addition to the support pins 38 and lands not being positioned in the imaging regions.

Second Embodiment

In the first embodiment above, in a case in which a support pin 38 or a land is positioned within the imaging region centered around the first coordinates, coordinate data generation device 100 automatically calculates coordinates such that there is no support pin 38 or land positioned within the imaging region, but the configuration is not limited to this. For example, in a case in which a support pin 38 or a land is positioned within the imaging region centered around the first coordinates, coordinate data generation device 100 may calculate multiple coordinates such that there is no support pin 38 or land positioned within the imaging region, and an operator may select one of the coordinates from the multiple calculated coordinates. Processing for generating coordinate data performed by coordinate data generation device 100 of a second embodiment is described below with reference to FIG. 6.

Figure 6:
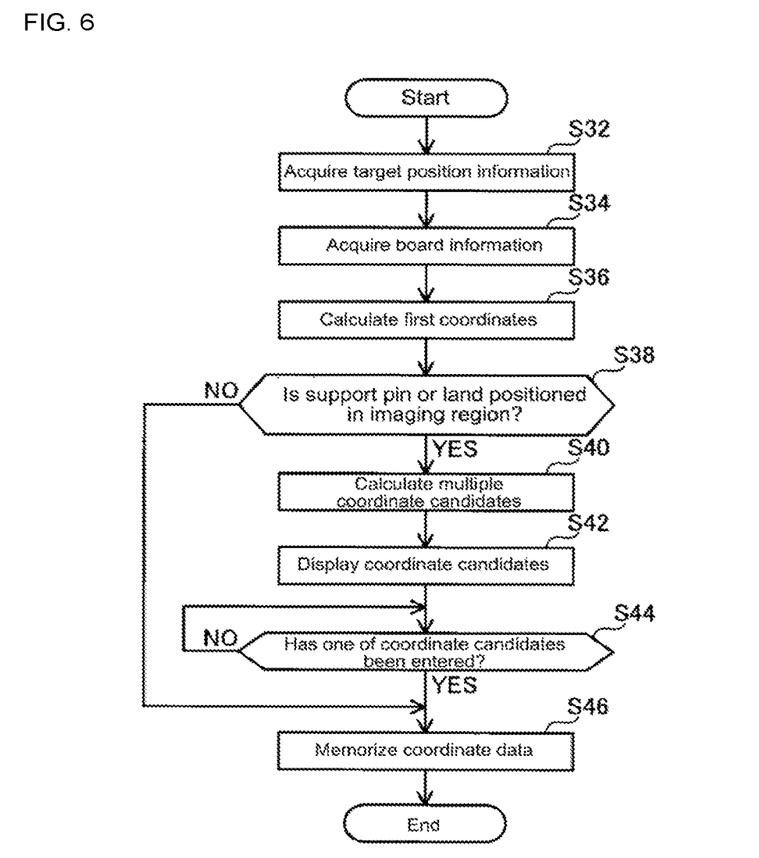
FIG. 6 is a flowchart showing an example of processing for generating coordinate data in a coordinate data generation device of a second embodiment.

As shown in FIG. 6, first, calculating device 40 acquires target position information (S32) and board information (S34). Then, coordinate data generation section 48 calculates the first coordinates (S36), and determining section 50 determines whether a support pin 38 or land is positioned within the imaging region centered around the first coordinates. Note that, processing of S32 to S38 is similar to that of S12 to S18 of the first embodiment, so detailed descriptions are omitted. In a case in which a support pin 38 or land is positioned within the imaging region centered around the first coordinates (yes in S38), processing proceeds to S40. On the other hand, in a case in which support pins 38 and the lands are not positioned within the imaging region centered around the first coordinates (no in S38), S40 to S44 are skipped and processing proceeds to S46.

In a case in which support pins 38 or the lands are positioned within the imaging region centered around the first coordinates (yes in S38), coordinate data generation section 48 calculates multiple coordinates as candidates for the next coordinate data to be generated (S40). For example, coordinate data generation section 48, with respect to the first coordinates, without changing the X coordinate, moves only the Y coordinate, and detects coordinates within the imaging region in which there is no support pin 38 or land. That is, coordinate data generation section 48 detects coordinates on the front edge of circuit board 2 that are coordinates within the imaging region in which there are no support pins 38 or lands. In a case in which there are multiple such coordinates, coordinate data generation section 48 detects all such coordinates. Then, the detected multiple coordinates (also referred to as coordinate candidates) are displayed on interface device 52 (S44). An operator selects one set of coordinates from the displayed multiple coordinate candidates and enters the selected coordinates into interface device 52.

Next, determining section 50 determines whether one set of coordinates has been entered from the multiple coordinate candidates that are displayed (S44). If one set of coordinates has not been selected from the displayed coordinate candidates (no in S44), processing stands by until one set of coordinates has been entered from the multiple coordinate candidates that are displayed. On the other hand, if one set of coordinates has been selected from the displayed coordinate candidates (yes in S44), coordinate data generation device 100 memorizes the calculated coordinates on coordinate data memory section 46 (S46). Then, calculating device 40 ends coordinate data generation processing.

With this embodiment too, similar to the first embodiment, coordinate data generation device 100 generates coordinate data such that the edge of circuit board 2 is included within the imaging region based on the board information and the information related to the target position. Therefore, even if the type of circuit board changes, coordinate data generation device 100 is able to set the imaging region based on the board information of the changed circuit board, and there is no need for an operator to perform work of setting coordinate data. Note that, in this embodiment too, similar to the first embodiment, in a case in which coordinates for which there is no support pin 38 or land arranged within the imaging region cannot be detected, an error message or the like may be displayed on interface device 52 to report to an operator that the coordinate data could not be calculated.

Technical elements described in this specification and in the drawings exhibit technical utility alone or in various combinations, and are not limited to the combination of the described aspects of the application. Also, the examples of the technology in this specification and the figures achieves multiple purposes at the same time but can also exhibit technical utility by achieving one among those purposes.

The invention claimed is:

1. A coordinate data generation device used by a component mounter configured to perform processing for mounting electronic components on boards of different dimensions by imaging the board that is controlled to be conveyed and stopped at a target position and performing the mounting of the electronic components after correcting for a deviation between a stopping position of the board identified from an image captured by the imaging and a target position, the coordinate data generation device used being configured to specify an imaging region for when performing the imaging of the board stopped at the stopping position, and the coordinate data generation device comprising:

a target position information input section configured to receive an input of information related to the target position that is set shared between the boards of different dimensions for which handling is possible by the component mounter;

a board information input section configured to receive input of board information including a dimension of the board in a first direction parallel to a conveyance direction of the board, and a dimension of the board in a second direction perpendicular to the conveyance direction; and a coordinate data generation section configured to generate coordinate data such that an edge of the board is within the imaging region based on the information related to the target position, the dimension of the board in the first direction, and the dimension of the board in the second direction, wherein the board information also includes arrangement positions of support pins configured to support the stopped board and arrangement positions of lands formed on the board, and the coordinate data generation section is configured to generate the coordinate data such that the support pins and the lands are not positioned within the imaging region based on the arrangement positions of the support pins and the arrangement positions of the lands.

2. The coordinate data generation device according to claim 1, wherein a position detection mark is provided on an imaging surface of the board, and the coordinate data generation section is configured to generate the coordinate data such that, among edges of the board that form an outline of the board, the edge for which the distance from the position detection mark is shortest is included in the imaging region.

3. A coordinate data generation device used by a component mounter configured to perform processing for mounting electronic components on boards of different dimensions by imaging the board that is controlled to be conveyed and stopped at a target position and performing the mounting of the electronic components after correcting for a deviation between a stopping position of the board identified from an image captured by the imaging and a target position, the coordinate data generation device used being configured to specify an imaging region for when performing the imaging of the board stopped at the stopping position, and the coordinate data generation device comprising:

a target position information input section configured to receive an input of information related to the target position that is set shared between the boards of different dimensions for which handling is possible by the component mounter;

a board information input section configured to receive input of board information including a dimension of the board in a first direction parallel to a conveyance direction of the board, and a dimension of the board in a second direction perpendicular to the conveyance direction; and a coordinate data generation section configured to generate coordinate data such that an edge of the board is within the imaging region based on the information related to the target position, the dimension of the board in the first direction, and the dimension of the board in the second direction, wherein the coordinate data generation section is configured to generate the coordinate data such that a position at a center in the second direction of the edge that is a front edge of the board in the first direction when the board is positioned at the target position is at center coordinates of the imaging region.

4. The coordinate data generation device according to claim 3, wherein the board information also includes arrangement positions of support pins configured to support the stopped board and arrangement positions of lands formed on the board, and the coordinate data generation device is provided with a reporting section configured to, when it is determined that at least one of the support pins or the lands is positioned within the imaging region that is specified by the coordinate data generation section, report that the at least one of the support pins or the lands is positioned within the imaging region.

5. A coordinate data generation method used by a component mounter configured to perform processing for mounting electronic components on boards of different dimensions by imaging the board that is controlled to be conveyed and stopped at a target position and performing the mounting of the electronic components after correcting for a deviation between a stopping position of the board identified from an image captured by the imaging and a target position, the coordinate data generation device used being configured to specify an imaging region for when performing the imaging of the board stopped at the stopping position, and the coordinate data generation method comprising:

a target position information input process of receiving an input of information related to the target position that is set shared between the boards of different dimensions for which handling is possible by the component mounter;

a board information input process of receiving input of board information including a dimension of the board in a first direction parallel to a conveyance direction of the board, and a dimension of the board in a second direction perpendicular to the conveyance direction; and a first coordinate data generation process of generating coordinate data such that an edge of the board is within the imaging region based on the information related to the target position, the dimension of the board in the first direction, and the dimension of the board in the second direction, wherein the board information also includes arrangement positions of support pins configured to support the stopped board and arrangement positions of lands formed on the board, and the coordinate data generation method further includes a second coordinate generation process of, when it is determined that at least one of the support pins or the lands is positioned within the imaging region that is specified by the first coordinate data generation process, generating the coordinate data such that the support pins and the lands are not positioned within the imaging region based on the arrangement positions of the support pins and the arrangement positions of the lands.

* * * * *